(12) United States Patent
Bhalla (10) Patent No.: US 9,769,946 B2
(45) Date of Patent: Sep. 19, 2017

(54) ENCLOSURE INCLUDING BARRIER ASSEMBLY

(71) Applicant: EATON CORPORATION, Cleveland, OH (US)

(72) Inventor: Richard Bhalla, Arden, NC (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/803,767

(22) Filed: Jul. 20, 2015

(65) Prior Publication Data
US 2017/0027072 A1   Jan. 26, 2017

(51) Int. Cl.
| H05K 5/06 | (2006.01) |
| H02B 1/30 | (2006.01) |
| H05K 5/02 | (2006.01) |
| H05K 7/14 | (2006.01) |
| H02B 13/025 | (2006.01) |

(52) U.S. Cl.
CPC .............. *H05K 5/068* (2013.01); *H02B 1/30* (2013.01); *H02B 1/306* (2013.01); *H05K 5/0221* (2013.01); *H05K 7/1432* (2013.01); *H02B 13/025* (2013.01)

(58) Field of Classification Search
CPC ...... H05K 5/068; H05K 5/069; H05K 5/0221; H05K 7/1432; H02B 1/306; H02B 1/30; E05C 9/00; E05C 9/22; E05C 9/008; E05B 63/14
USPC ........ 292/32, 33, 37, 42; 312/215, 216, 217, 312/222, 296, 223.2; 49/394, 395
See application file for complete search history.

(56) References Cited

U.S. PATENT DOCUMENTS

| 4,800,822 | A | * | 1/1989 | Adkins | ................... A47B 55/00 109/19 |
| 4,864,466 | A | * | 9/1989 | Gasparetto | ............... H02B 1/44 200/304 |
| 5,215,212 | A | * | 6/1993 | Stephan | ............. G11B 23/0236 206/387.12 |
| 6,512,669 | B1 | | 1/2003 | Goodwin et al. | |
| 7,871,137 | B2 | * | 1/2011 | Schulz | ..................... H02B 1/28 312/296 |
| 8,328,246 | B2 | * | 12/2012 | Zhang | ...................... H05K 5/02 292/137 |
| 8,733,853 | B2 | * | 5/2014 | Gingrich | .................. H02B 1/38 312/216 |

(Continued)

OTHER PUBLICATIONS

European Patent Office, "International Search Report and Written Opinion", corresp. to PCT/US2016/041690, Oct. 11, 2016, 15 pp.

*Primary Examiner* — James O Hansen
(74) *Attorney, Agent, or Firm* — Eckert Seamans; Nathaniel Wilks; Philip Levy (57) ABSTRACT

An enclosure including a top surface, a bottom surface, a rear surface, sidewalls, and a door configured to open and close. The top surface, the bottom surface, the rear surface, the sidewalls and the door, when closed, define an interior area. The enclosure further includes at least one barrier assembly attached to at least one of the top surface, the bottom surface, the first side surface and the second side surface in the interior area. The at least one barrier assembly includes a barrier member including a substantially planar barrier portion disposed substantially parallel to one of the top surface, the bottom surface or the sidewalls and a spring assembly attached to the barrier member and configured to bias the barrier portion in a direction of the door.

19 Claims, 12 Drawing Sheets

(56) References Cited

U.S. PATENT DOCUMENTS

| | | |
|---|---|---|
| 2012/0097413 A1 | 4/2012 | Bugaris et al. |
| 2013/0265737 A1 | 10/2013 | Bugaris et al. |
| 2013/0298468 A1* | 11/2013 | Gasparetto .............. E05B 65/06 49/70 |
| 2013/0320831 A1* | 12/2013 | Schmidt ............... H02B 13/025 312/296 |
| 2014/0211443 A1 | 7/2014 | Pharne et al. |

* cited by examiner

ENCLOSURE INCLUDING BARRIER ASSEMBLY

BACKGROUND

Field

The disclosed concept relates generally to enclosures, more particularly to enclosures including barrier assemblies.

Background Information

Electrical equipment such as, without limitation, a medium voltage control starter, is often housed in an enclosure. The enclosure includes a door which provides access to the equipment housed in the enclosure.

An arc fault in the electrical equipment can cause a tremendous amount of pressure on the interior of the enclosure. The pressure can cause the door to deform (e.g., without limitation, bulge out). The deformation often results in a gap between the door and the top, bottom or sidewalls of the enclosure. Arc gasses can escape the enclosure through this gap, thus creating an unsafe situation. It would be desirable to keep such gasses from escaping the enclosure.

There is room for improvement in enclosures.

SUMMARY

These needs and others are met by embodiments of the disclosed concept, which are directed to an enclosure including a door and at least one barrier assembly including a barrier portion and a spring assembly structured to bias the barrier portion in a direction of the door.

In accordance with aspects of the disclosed concept, an enclosure comprises: a top surface; a bottom surface; a rear surface; sidewalls; a door configured to open and close, wherein the top surface, the bottom surface, the rear surface, the sidewalls and the door, when closed, define an interior area; and at least one barrier assembly attached to at least one of the top surface, the bottom surface, the first side surface and the second side surface in the interior area, the at least one barrier assembly comprising: a barrier member including a substantially planar barrier portion disposed substantially parallel to one of the top surface, the bottom surface or the sidewalls; and a spring assembly attached to the barrier member and configured to bias the barrier portion in a direction of the door.

BRIEF DESCRIPTION OF THE DRAW

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are "coupled" together shall mean that the parts are joined together either directly or joined through one or more intermediate parts.

As employed herein, the term "number" shall mean one or an integer greater than one (i.e., a plurality).

Some elements shown in the drawings are repeated numerous times. In order to improve the clarity of the drawings, some reference numbers refer to an exemplary element but are omitted for repeat instances of the element.

Figure 1:
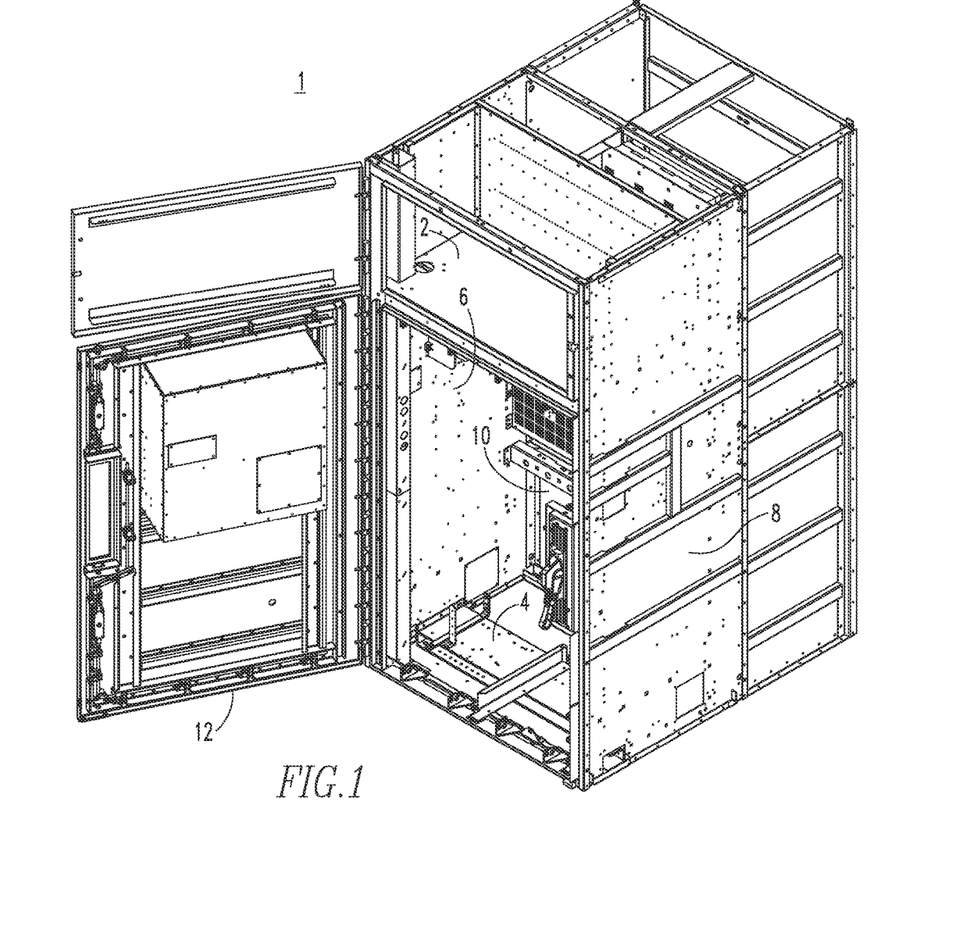
FIG. 1 is an isometric view of an enclosure in accordance with an example embodiment of the disclosed concept.

FIG. 1 is an isometric view of an enclosure 1 in accordance with an example embodiment of the disclosed concept. The enclosure 1 includes an interior area defined by a top 2, a bottom 4, sidewalls 6,8, a rear wall 10 and a door 12 (when the door is closed). The interior area may be suitable fir housing electrical equipment such as, without limitation, a medium voltage control starter.

Figure 2A:
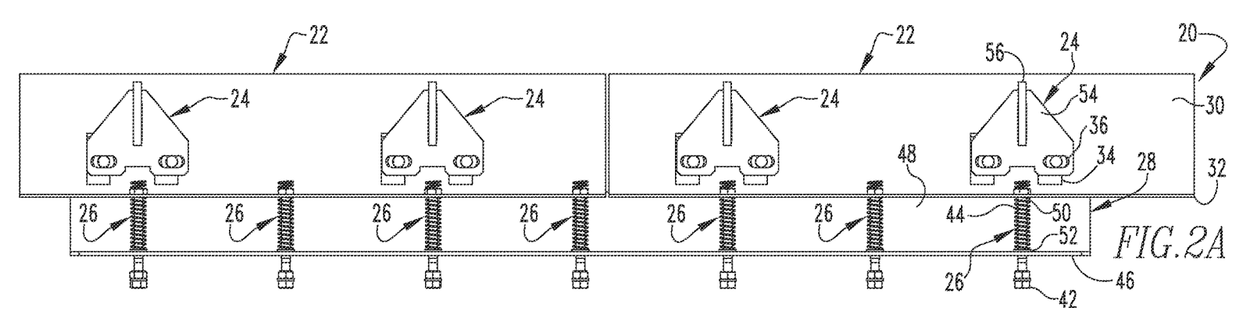
FIG. 2A is a front view of a barrier assembly in accordance with an example embodiment of the disclosed concept.
Figure 2B:
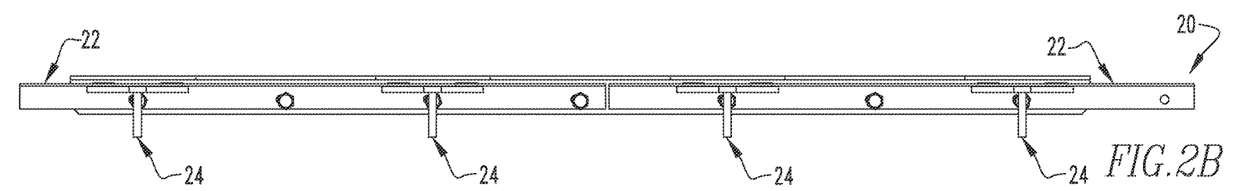
FIG. 2B is a top view of the barrier assembly of FIG. 2A.
Figure 2C:
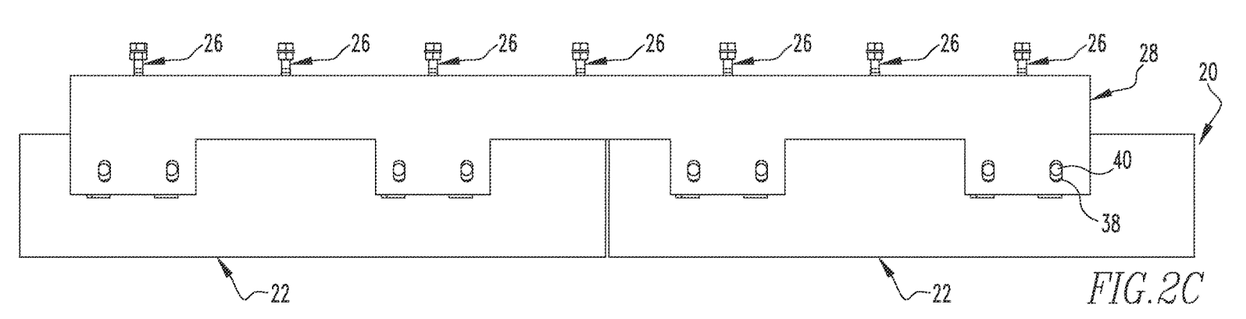
FIG. 2C is a rear view of the barrier assembly of FIG. 2A.
Figure 2D:
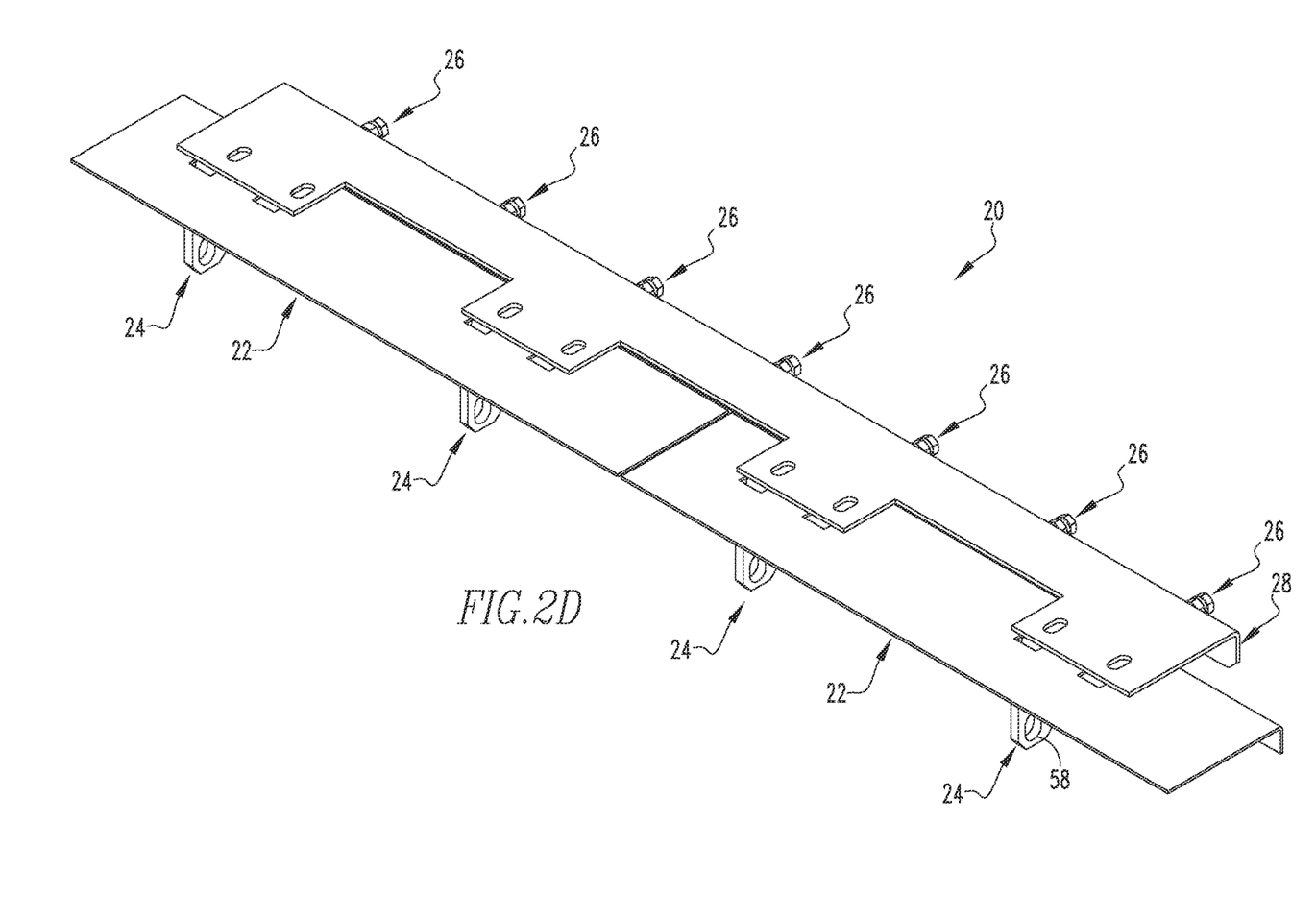
FIG. 2D is an isometric view of the barrier assembly of FIG. 2A.

FIG. 2A is a front view of a barrier assembly 20 in accordance with an example embodiment of the disclosed concept. FIG. 2B is a top view of the barrier assembly 20 of FIG. 2A. FIG. 2C is a rear view of the barrier assembly 20 of FIG. 2A. FIG. 2D is an isometric view of the barrier assembly 20 of FIG. 2A.

The barrier assembly 20 includes two barrier members 22, four latch catch members 24, seven spring assemblies 26 and a bracket 28. It will be appreciated by those having ordinary skill in the art that the number of barrier members 22, latch catch members 24 and spring assemblies 26 included in the barrier assembly 20 may be varied without departing from the scope of the disclosed concept.

The barrier members 22 each include a barrier portion 30 and a lip 32. The barrier portion 30 and the lip 32 are substantially planar members arranged perpendicular with each other so as to form an "L-shape". The barrier portion 30 is significantly larger than the lip 32. When the barrier member 22 is installed in the enclosure 1 of FIG. 1, the barrier portion 30 is substantially parallel to the surface it is installed on (i.e, the top 2, bottom 4 or one of the sidewalls 6,8 of the enclosure 1).

The bracket 28 includes rear portion 48 and a lip 46. The rear portion 48 and the lip 46 are substantially planar members arranged perpendicular with each other so as to form an "L-shape".

A number of apertures 34 are formed in the barrier portion 30. Corresponding apertures 36,38 are also formed in the latch catch members 36 and rear portion 48 of the bracket 28, respectively. The barrier members 22, latch catch members 24 and bracket 28 are coupled to each other via fasteners 40 that extend through the apertures 34,36,38. The apertures 34,38 formed in the barrier portion 30 and the rear portion 48 of the bracket 28 are elongated so as to allow the barrier members 22 and the bracket 28 to move a limited distance with respect to each other.

A second number of apertures 50 are formed in the lip 32 of the barrier members 22. A second corresponding number of apertures 52 are formed in the lip 46 of the bracket 28. The spring assemblies 26 include fasteners 42 that extend through the apertures 50,52 and couple the bracket 28 to the barrier members 22. The spring assemblies 26 further include springs 44. The springs 44 are disposed between the lip 46 bracket 28 and the lips 32 of the barrier members 22 and the fasteners 42 pass through the inside of the springs 44. The springs 44 are operable to bias the barrier members 22 in a direction away from the bracket 28. In more detail, the springs 44 bias the lips 32 of the barrier members 22 in a direction away from the lip 46 of the bracket 28. When the barrier assembly 20 is installed in the enclosure 1 of FIG. 1, the springs 44 bias the barrier members 22 in a direction towards the door 12 of the enclosure 1.

The latch catch members 24 each include a barrier coupling portion 54 and a latch coupling portion 56. The barrier coupling portion 54 includes the apertures 36 used to couple the latch catch member 24 to the barrier member 22 and the bracket 28. The latch coupling portion 56 extends in a direction perpendicular to the barrier coupling portion 54. A latch coupling aperture 58 is formed in the latch coupling portion 56. The latch coupling aperture 56 is structured to interact with a latch mechanism of the door 12 of the enclosure 1 of FIG. 1.

Figure 3A:
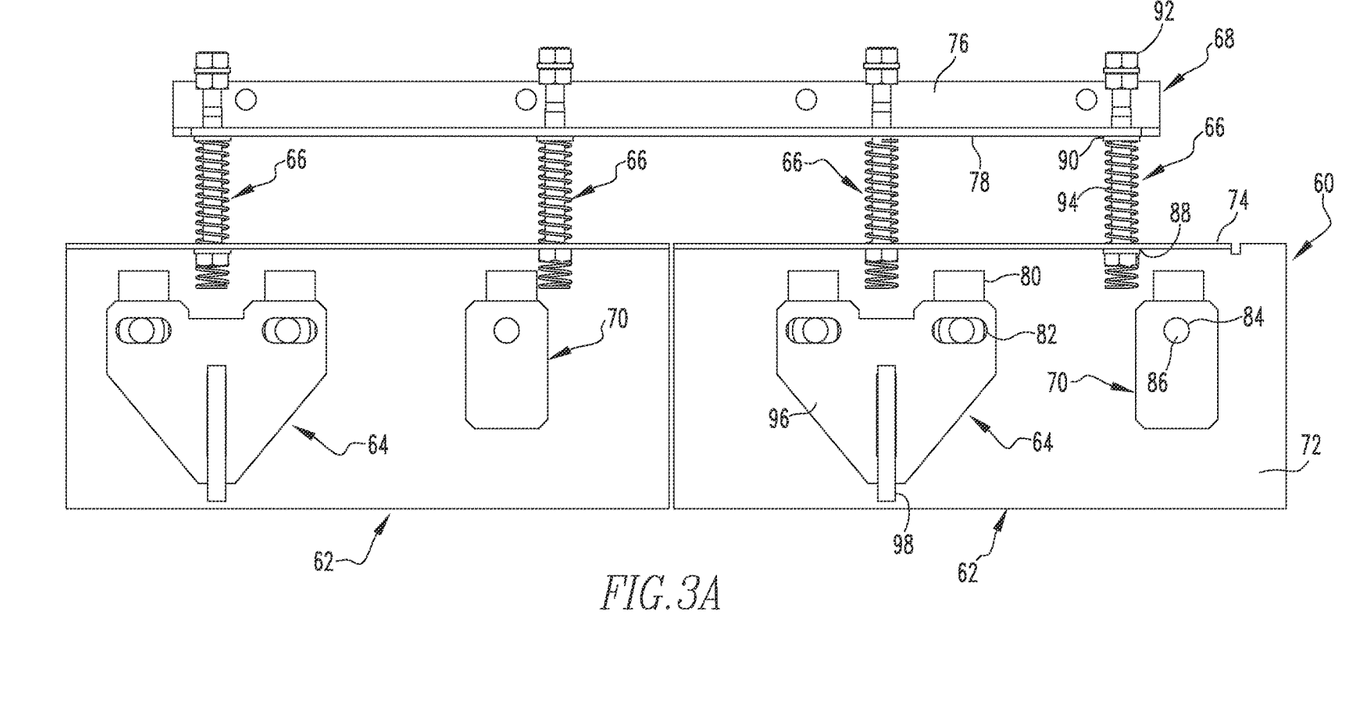
FIG. 3A is a front view of a barrier assembly in accordance with another example embodiment of the disclosed concept.
Figure 3B:
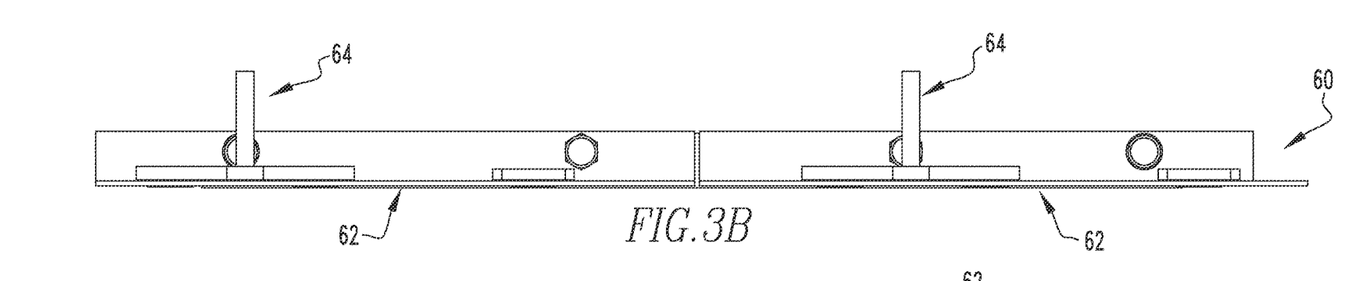
FIG. 3B is a top view of the barrier assembly of FIG. 3A.
Figure 3C:
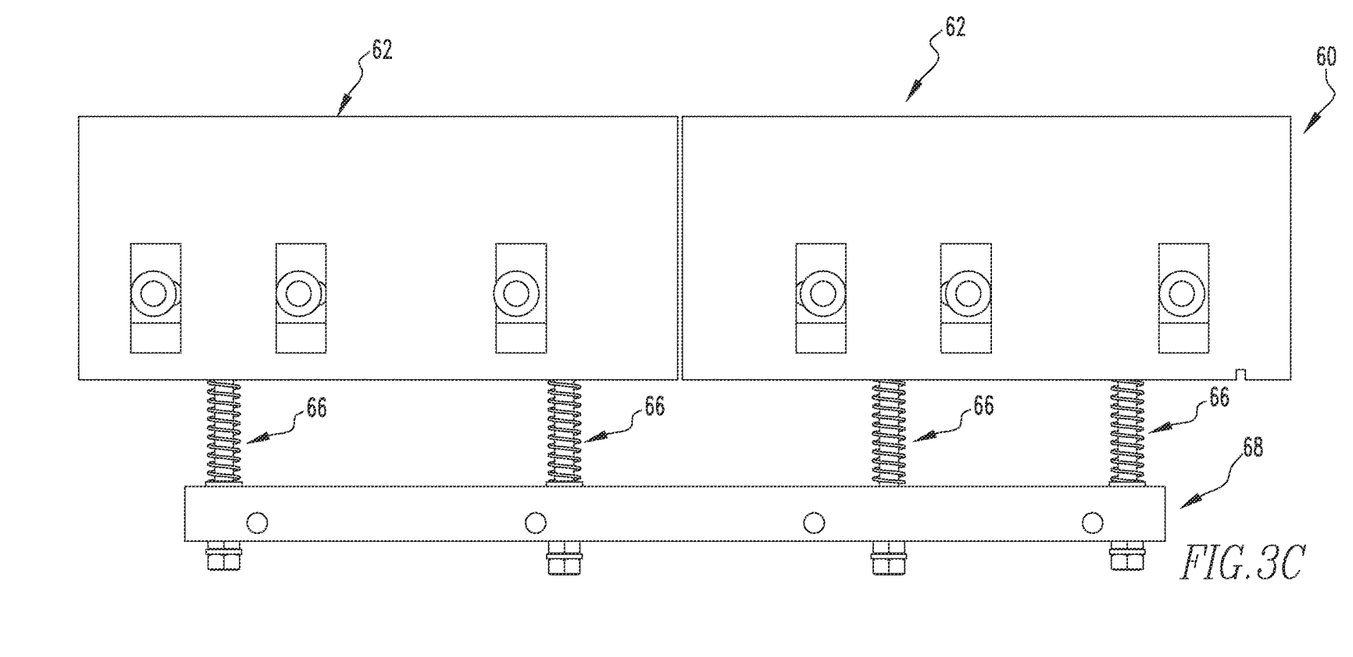
FIG. 3C is a rear view of the barrier assembly of FIG. 3A.
Figure 3D:
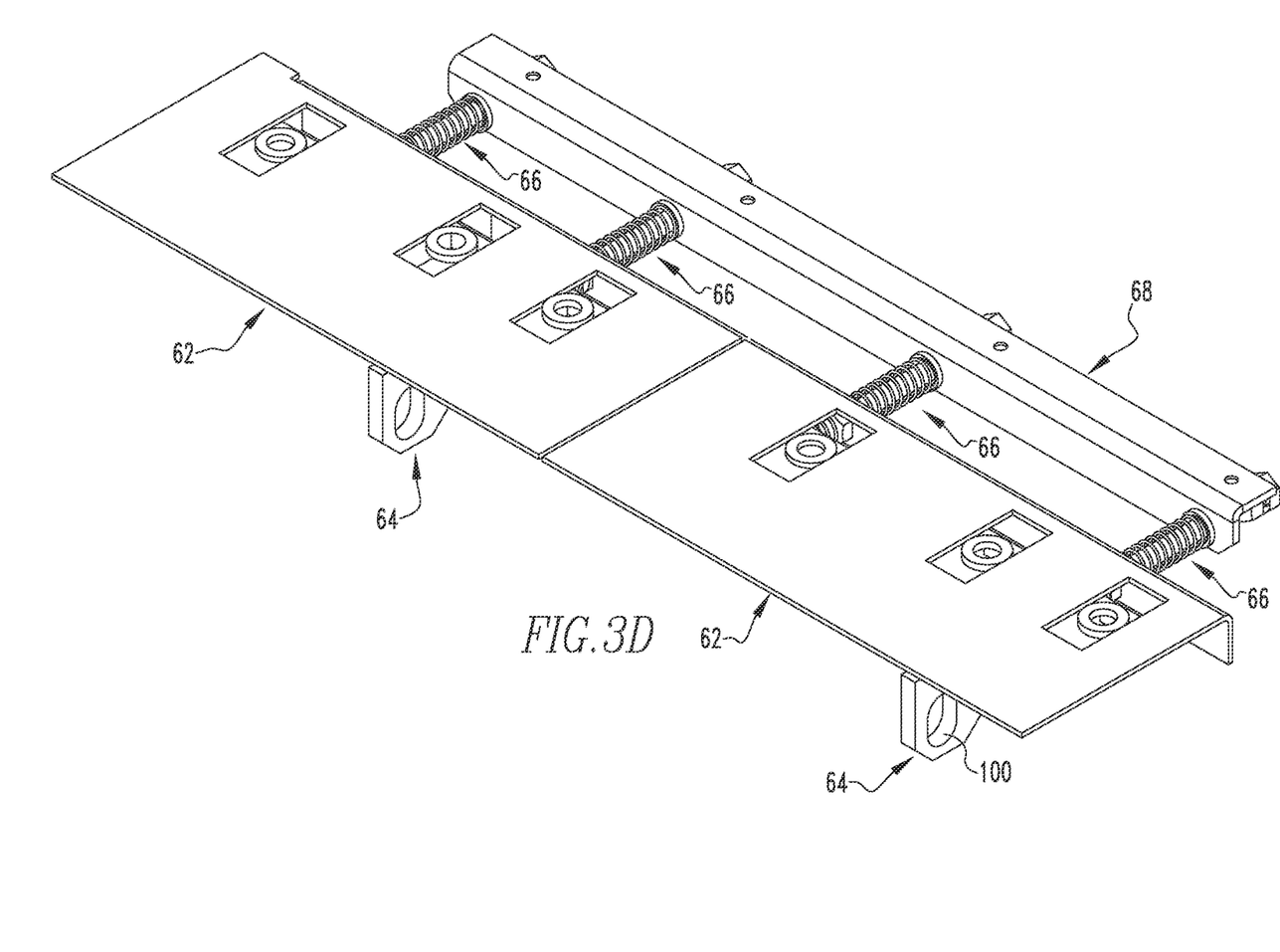
FIG. 3D is an isometric view of the barrier assembly of FIG. 3A.

FIG. 3A is a front view of a barrier assembly 60 in accordance with an example embodiment of the disclosed concept. FIG. 3B is a top view of the barrier assembly 60 of FIG. 3A. FIG. 3C is a rear view of the barrier assembly 60 of FIG. 3A. FIG. 3D is an isometric view of the barrier assembly 60 of FIG. 3A.

The barrier assembly 60 includes two barrier members 62, two latch catch members 64, four spring assemblies 66 and a bracket 68. The barrier assembly 60 also includes two filler members 70. It will be appreciated by those having ordinary skill in the art that the number of barrier members 62, latch catch members 64, spring assemblies 66 and filler members 70 included in the barrier assembly 60 may be varied without departing from the scope of the disclosed concept.

The barrier members 62 each include a barrier portion 72 and a lip 74. The barrier portion 72 and the lip 74 are substantially planar members arranged perpendicular with each other so as to form an "L-shape". The barrier portion 72 is significantly larger than the lip 74. When the barrier member 62 is installed in the enclosure 1 of FIG. 1, the barrier portion 72 is substantially parallel to the surface it is installed on (i.e, the top 2, bottom 4 or one of the sidewalls 6,8 of the enclosure 1).

The bracket 68 includes rear portion 76 and a lip 78. The rear portion 76 and the lip 78 are substantially planar members arranged perpendicular with each other so as to form an "L-shape".

A number of apertures 80 are formed in the barrier portion 72. Corresponding apertures 82,84 are also formed in the latch catch members 64 and finer members 70, respectively. The barrier members 62 are coupled to the latch catch members 64 and the filler members 70 via fasteners 86 that extend through the apertures 80,82,84.

A second number of apertures 88 are formed in the lip 74 of the barrier members 62. A second corresponding number of apertures 90 are formed in the lip 78 of the bracket 68. The spring assemblies 66 include fasteners 92 that extend through the apertures 88,90 and couple the bracket 68 to the barrier members 62. The spring assemblies 66 further include springs 94. The springs 94 are disposed between the tip 74 of the bracket 68 and the lips 74 of the barrier members 62 and the fasteners 92 pass through the inside of the springs 94. The springs 94 are operable to bias the barrier members 62 in a direction away from the bracket 68. In more detail, the springs 94 bias the lips 742 of the barrier members 62 in a direction away from the lip 78 of the bracket 68. When the barrier assembly 60 is installed in the enclosure 1 of FIG. 1, the springs 94 bias the barrier members 62 in a direction towards the door 12 of the enclosure 1.

The latch catch members 64 each include a barrier coupling portion 96 and a latch coupling portion 98. The barrier coupling portion 96 includes the apertures 82 used to couple the latch catch member 64 to the barrier member 62. The latch coupling portion 98 extends in a direction perpendicular to the barrier coupling portion 96. A latch coupling aperture 100 is formed in the latch coupling portion 98. The latch coupling aperture 100 is structured to interact with a latch mechanism of the door 12 of the enclosure 1 of FIG. 1.

The barrier assembly 60 of FIGS. 3A-D is similar to the barrier assembly 20 of FIGS. 2A-D. However, the barrier assembly 60 of FIGS. 3A-D includes a bracket 68 whose rear portion 76 does not couple with the barrier members 62. Rather, the rear portion 76 of the bracket 68 is suitable to couple to the enclosure 1.

Figure 4A:
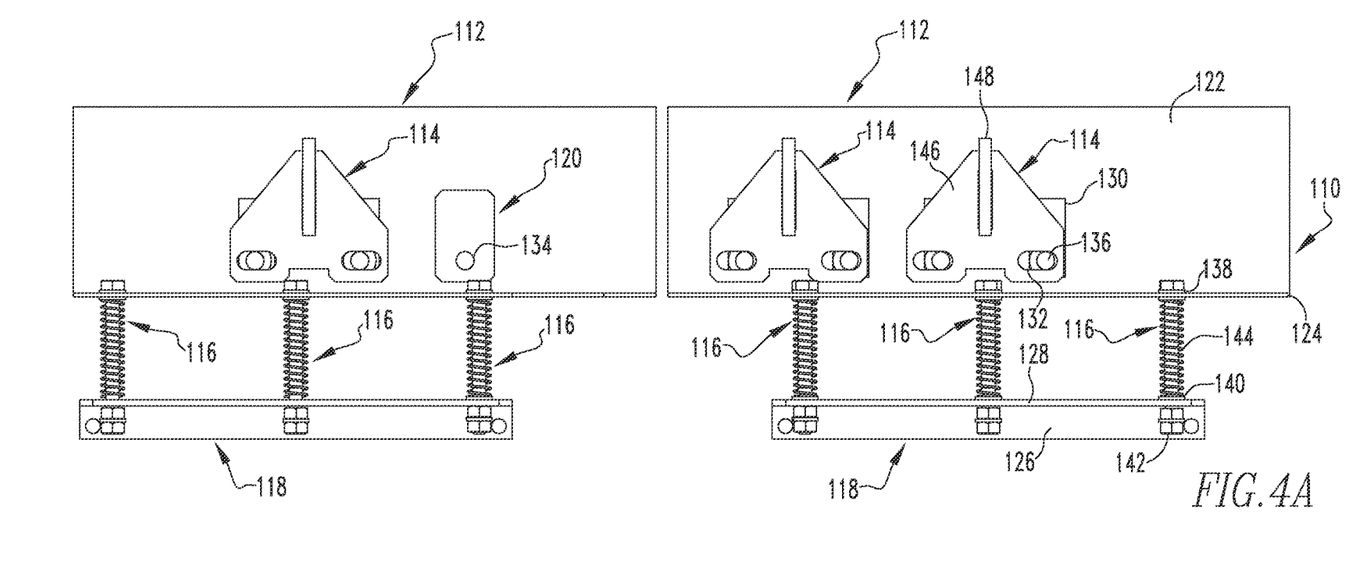
FIG. 4A is a front view of a barrier assembly in accordance with another example embodiment of the disclosed concept.
Figure 4B:
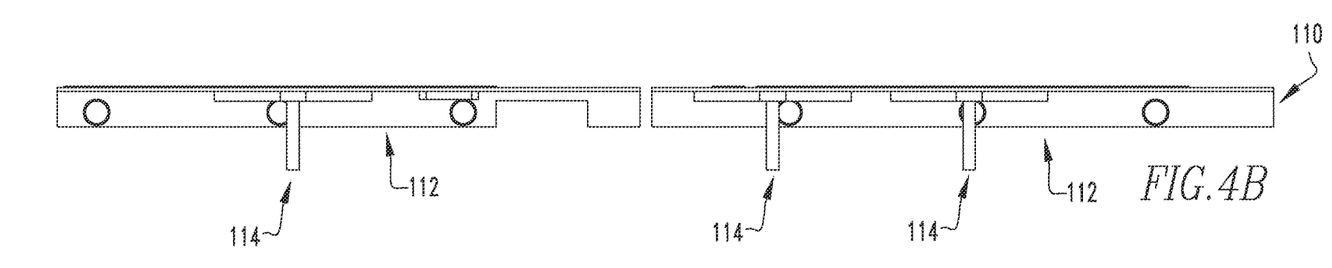
FIG. 4B is a top view of the barrier assembly of FIG. 4A.
Figure 4C:
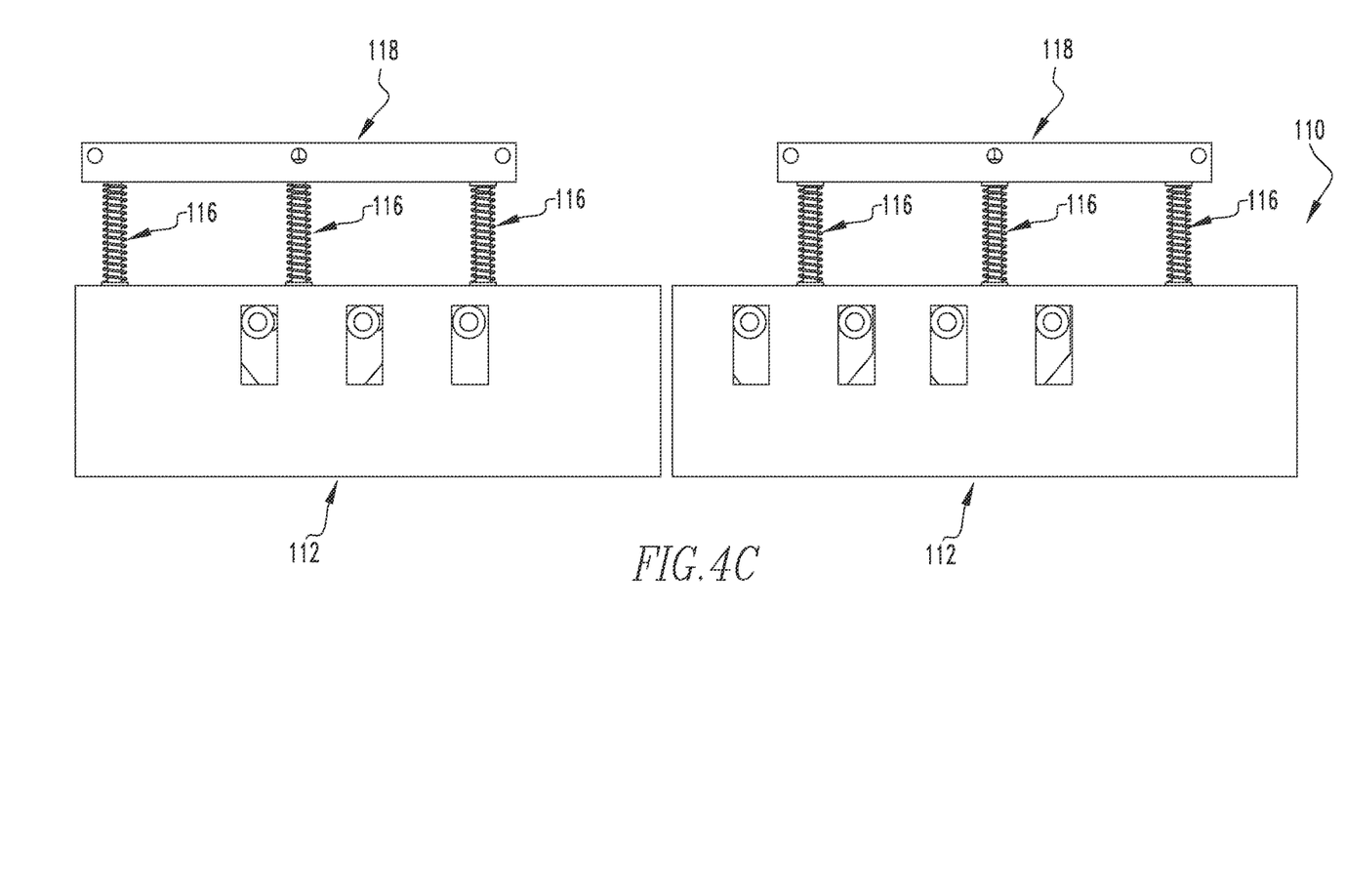
FIG. 4C is a rear view of the barrier assembly of FIG. 4A.
Figure 4D:
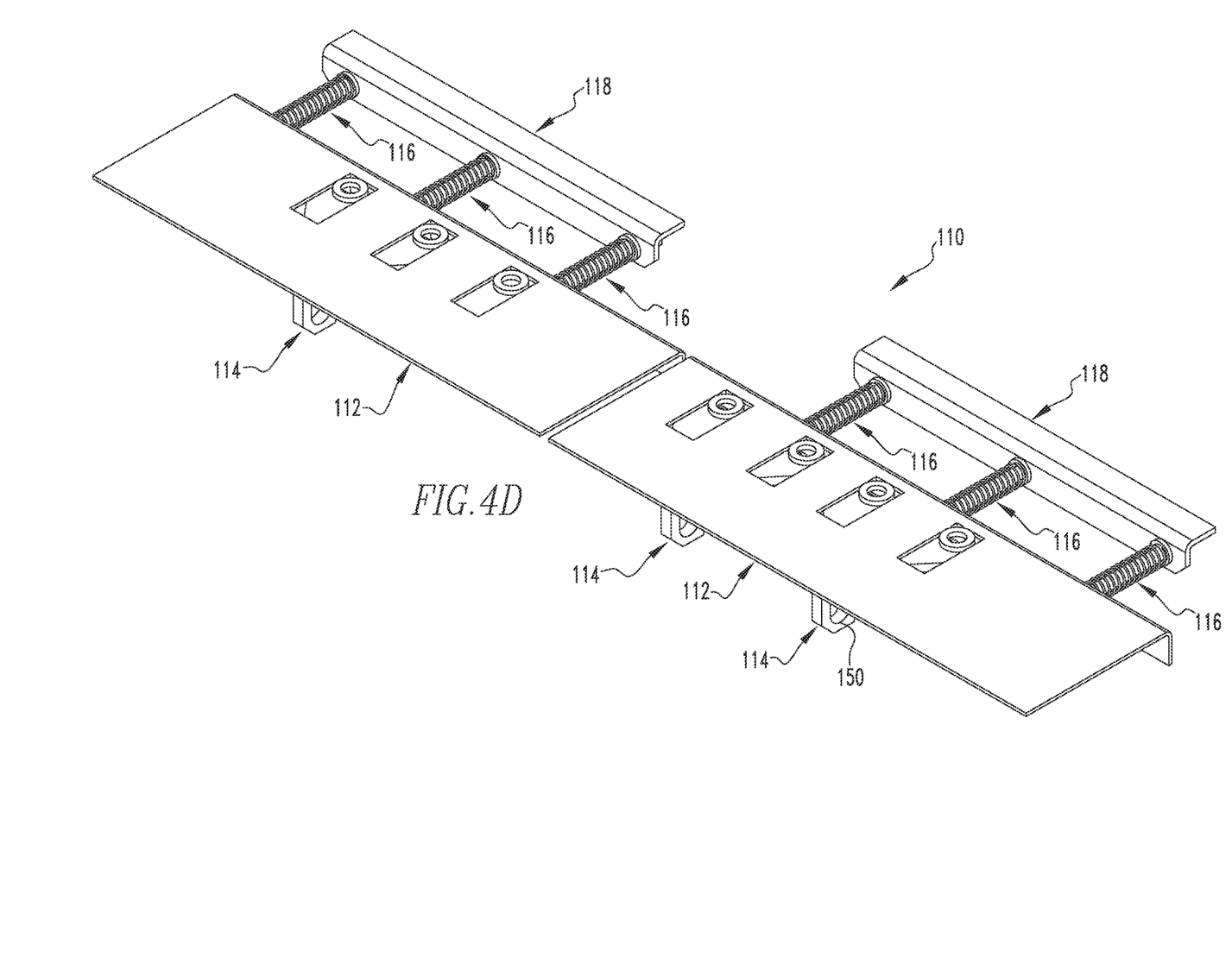
FIG. 4D is an isometric view of the barrier assembly of FIG. 4A.

FIG. 4A is a front view of a barrier assembly 110 in accordance with an example embodiment of the disclosed concept. FIG. 4B is a top view of the barrier assembly 110 of FIG. 4A. FIG. 4C is a rear view of the barrier assembly 110 of FIG. 4A. FIG. 4D is an isometric view of the barrier assembly 110 of FIG. 4A.

The barrier assembly 110 includes two barrier members 112, three latch catch members 114, six spring assemblies 116 and two brackets 118. The barrier assembly 110 also includes a filler member 120. It will be appreciated by those having ordinary skill in the art that the number of barrier members 112, latch catch members 114, spring assemblies 116, brackets 118 and filler members 120 included in the barrier assembly 110 may be varied without departing from the scope of the disclosed concept.

The barrier members 112 each include a barrier portion 122 and a tip 124. The barrier portion 122 and the lip 124 are substantially planar members arranged perpendicular with each other so as to form an "L-shape". The barrier portion 122 is significantly larger than the tip 124. When the barrier member 122 is installed in the enclosure 1 of FIG. 1, the barrier portion 122 is substantially parallel to the surface it is installed on (i.e, the top 2, bottom 4 or one of the sidewalls 6,8 of the enclosure 1).

The bracket 128 includes rear portion 126 and a lip 128. The rear portion 126 and the lip 128 are substantially planar members arranged perpendicular with each other so as to form an "L-shape".

A number of apertures 130 are formed in the barrier portion 122. Corresponding apertures 132,134 are also formed in the latch catch members 114 and filler members 120, respectively. The barrier members 122 are coupled to the latch catch members 114 and the filler members 120 via fasteners 136 that extend through the apertures 130,132,134.

A second number of apertures 138 are formed in the lip 124 of the barrier members 112. A second corresponding number of apertures 140 are formed in the lip 128 of the brackets 118. The spring assemblies 116 include fasteners 142 that extend. through the apertures 138,140 and couple the brackets 118 to the barrier members 112. The spring assemblies 116 further include springs 144. The springs 144 are disposed. between the lips 128 of the brackets 118 and the lips 124 of the barrier members 112 and the fasteners 142 pass through the inside of the springs 144. The springs 144 are operable to bias the barrier members 112 in a direction away from the brackets 118. In more detail, the springs 144 bias the tips 124 of the barrier members 112 in a direction away from the lips 128 of the brackets 118. When the barrier assembly 110 is installed in the enclosure 1 of FIG. 1, the springs 144 bias the barrier members 112 in a direction towards the door 12 of the enclosure 1.

The latch catch members 114 each include a barrier coupling portion 146 and a latch coupling portion 148. The barrier coupling portion 146 includes the apertures 132 used to couple the latch catch member 114 to the barrier member 112. The latch coupling portion 148 extends in a direction perpendicular to the barrier coupling portion 146. A latch coupling aperture 150 is formed in the latch coupling portion 148. The latch coupling aperture 150 is structured to interact with a latch mechanism of the door 12 of the enclosure 1 of FIG. 1.

The barrier assembly 110 of FIGS. 4A-D is similar to the barrier assembly 60 of FIGS. 3A-D. However, the barrier assembly 110 of FIGS. 4A-D includes, among some other differences, two brackets 118 instead of a single bracket 68.

Figure 5A:
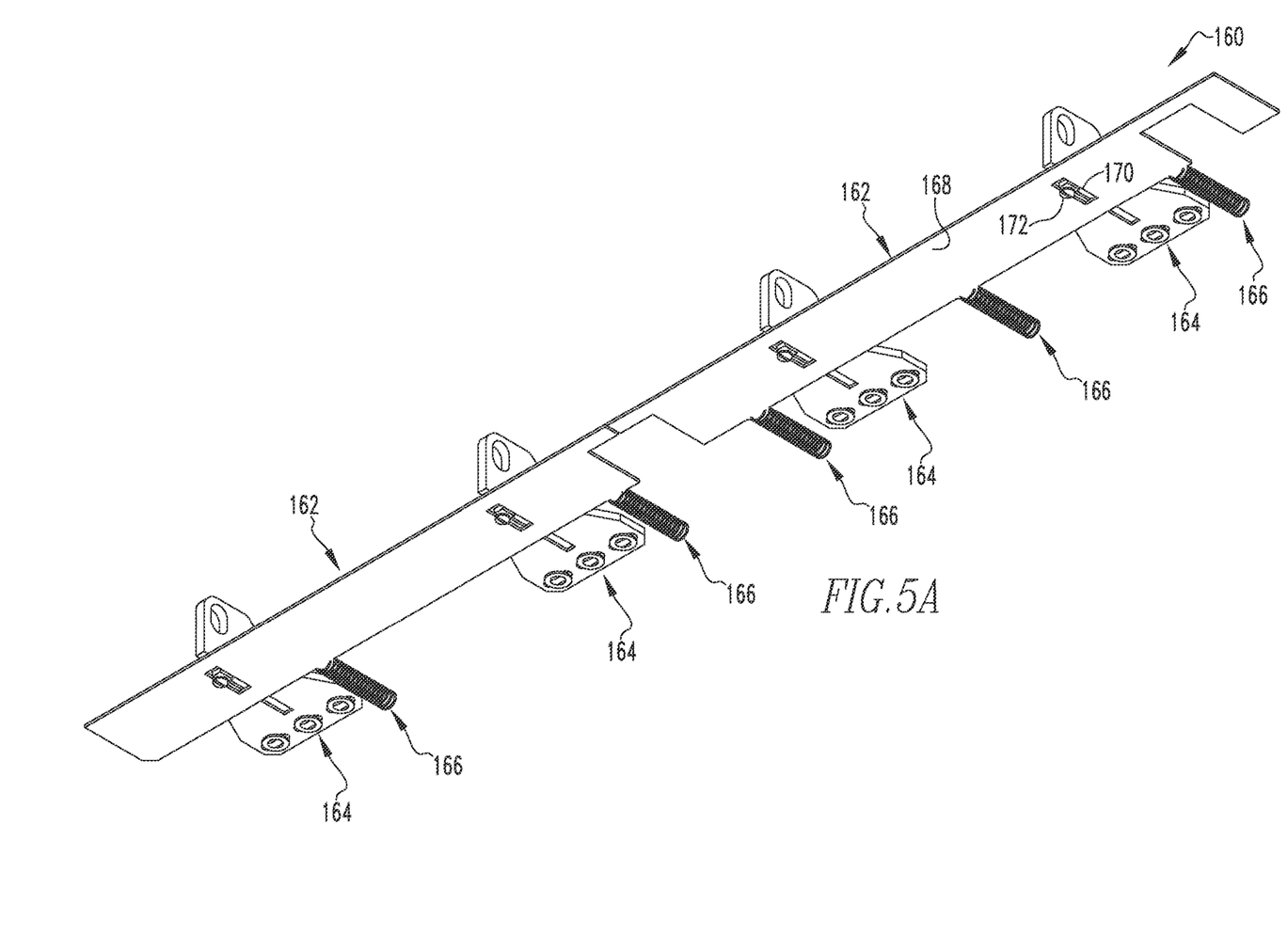
FIGS. 5A and 5B are isometric views of barrier assemblies in accordance with another example embodiment of the disclosed concept.
Figure 5B:
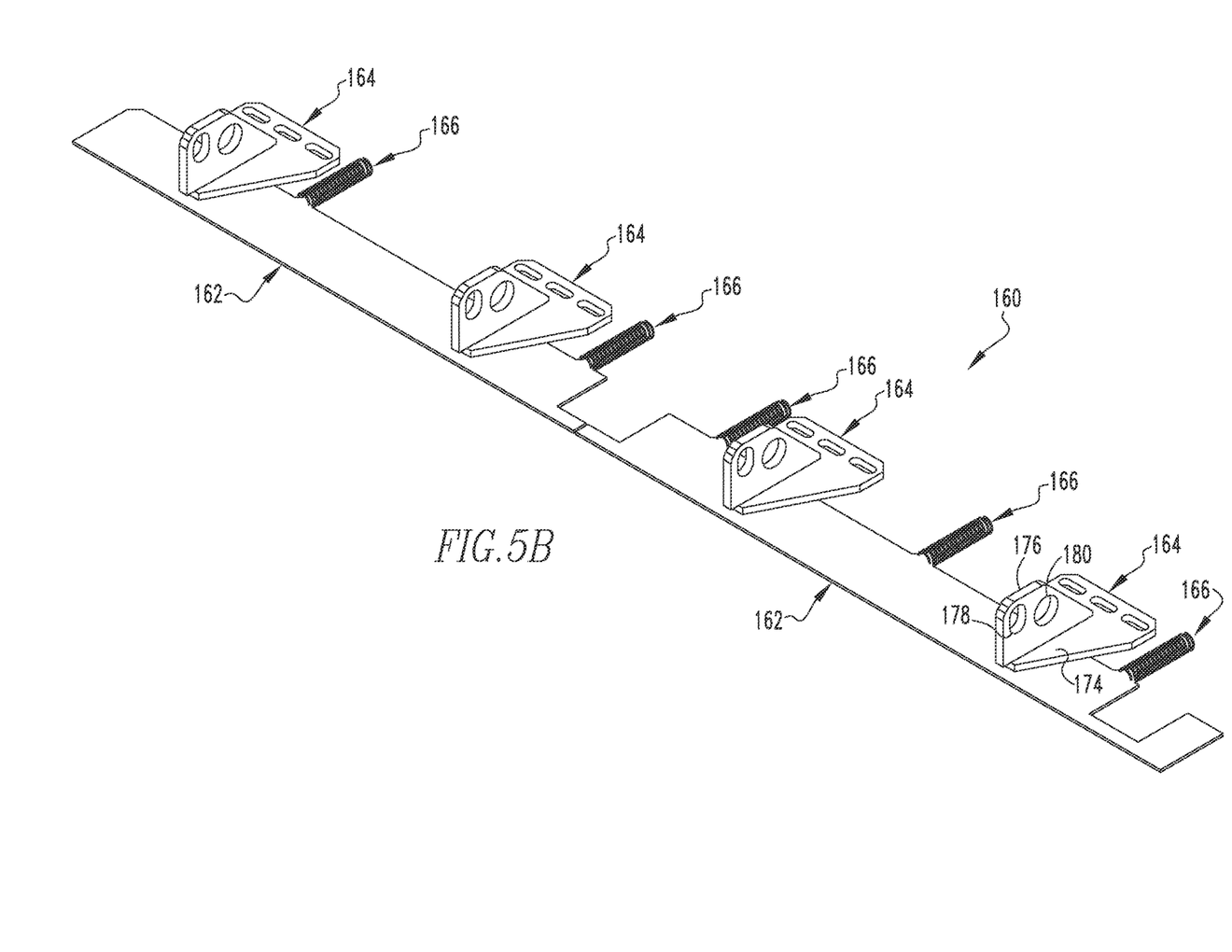

FIGS. 5A and 5B are an isometric views of a barrier assembly 160 in accordance with an example embodiment of the disclosed concept. The barrier assembly 160 includes two barrier members 162, four latch catch members 164 and five spring assemblies 166. It will be appreciated by those having ordinary skill in the art that the number of barrier members 162, latch catch members 164 and spring assemblies 166 included in the barrier assembly 160 may be varied without departing from the scope of the disclosed concept.

The barrier members 162 each include a barrier portion 168. When the barrier member 162 is installed in the enclosure 1 of FIG. 1, the barrier portion 168 is substantially parallel to the surface it is installed on (i.e, the top 2, bottom 4 or one of the sidewalls 6,8 of the enclosure 1).

A number of apertures 170 are formed in the barrier portion 168. The barrier members 162 are coupled to the latch catch members 164 via fasteners 172 that extend through the apertures 170.

The spring assemblies 166 include springs 174. The springs 174 are operable to bias the barrier members 162 in a direction towards the door 12 of the enclosure 1, when the barrier assembly 160 is installed in the enclosure 1 of FIG. 1.

The latch catch members 164 each include a barrier coupling portion 174 and a latch coupling portion 176. The latch coupling portion 176 extends in a direction perpendicular to the barrier coupling portion 174. Latch coupling apertures 178,180 are formed in the latch coupling portion 176. The latch coupling apertures 178,180 are structured to interact with a latch mechanism of the door 12 of the enclosure 1 of FIG. 1.

While the barrier assemblies 20,60,110,160 shown and described with respect to FIGS. 2A-5B each have differences with one another, they each operate according to a similar principle. Namely, the barrier assemblies 20,60,110, 160 each include barrier members 22,62,112,162 that are biased in a direction of the door 12 of the enclosure 1 by spring assemblies 26,66,116,166 when the barrier members 20,60,110,160 are installed on the enclosure 1. In the case that there is an arc fault in the enclosure 1 that causes the door 12 to bulge outwards, the barrier members 22,62,112, 162 of the barrier assemblies 20,60,110,160 are biased towards the door 12 and move outward with the bulge of the door 12. This movement prevents causes the barrier members 22,62,112,162 to be disposed in the area of any gaps that form between the top 2, bottom 4, or sidewalls 6,8 of the enclosure 1 and the door 12, thus preventing arc gasses from escaping the interior area of the enclosure 1.

The differences in the barrier assemblies 20,60,110,160 may make the barrier assemblies 20,60,110,160 more amenable to installation on a particular surface of the enclosure 1. For example and without limitation, in one example embodiment of the disclosed concept, the barrier assembly of FIGS. 2A-D is installed on the top surface 2 of the enclosure 1, the barrier assembly 60 of FIGS. 3A-3D is installed on one of the sidewalls 6,8 of the enclosure 1, the barrier assembly 110 of FIGS. 4A-D is installed on the other of the sidewalls 6,8 of the enclosure 1, and the barrier assembly 160 of FIGS. 5A-B is installed on the bottom surface 4 of the enclosure 1.

Figure 6:
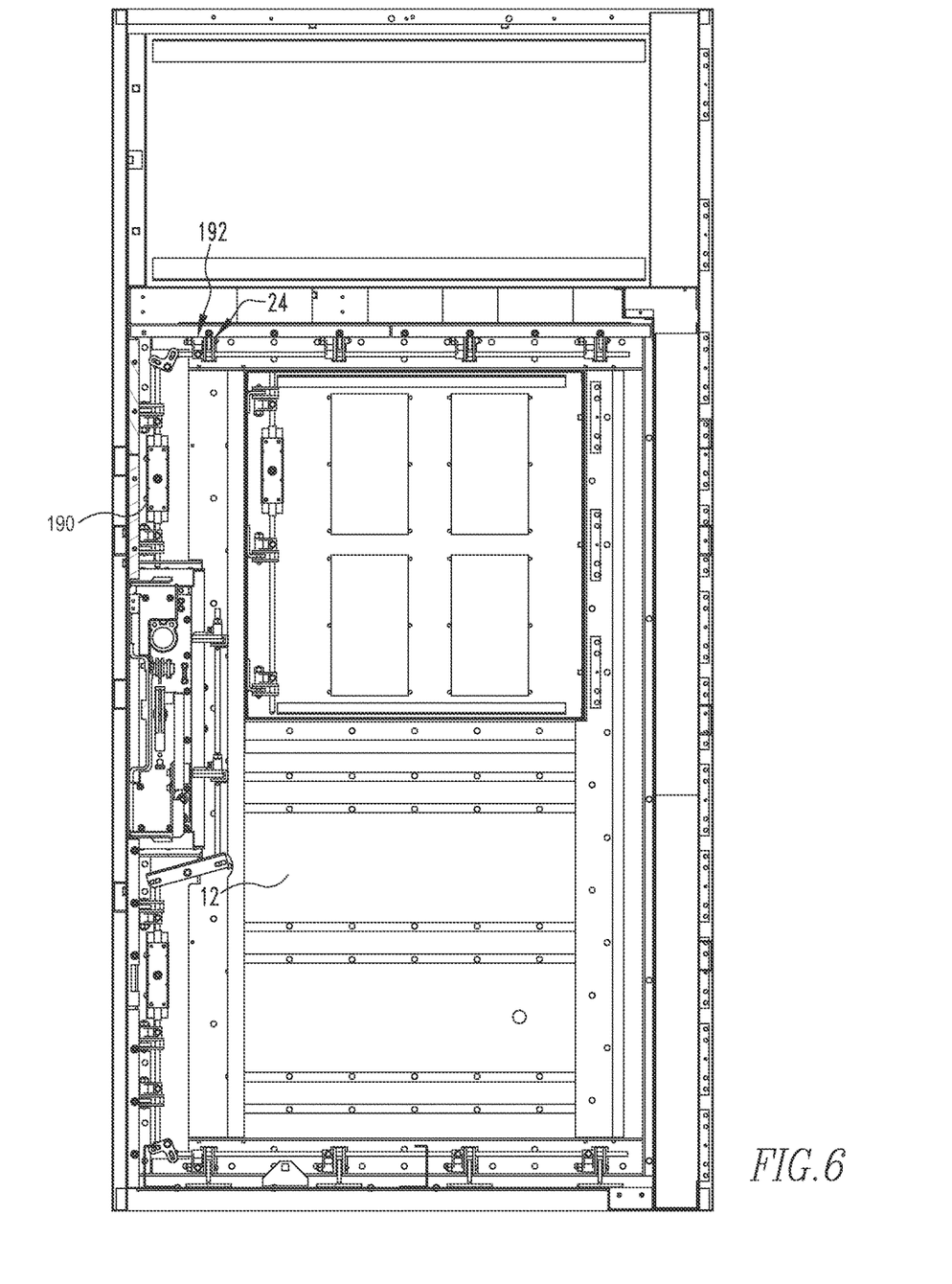
FIG. 6 is a view of a latch mechanism in accordance with an example embodiment of the disclosed concept.

FIG. 6 is a view of the inside of the door 12 in accordance with an example embodiment of the disclosed concept. As shown in FIG. 6, the door 12 includes a latch mechanism 190. The latch mechanism 190 extends around the door 12 in an outer perimeter area of the door 12. The latch mechanism interacts with the latch catch members 24,64,114,164 (only latch catch member 24 is shown in FIG. 6) of the barrier assemblies 20,60,110,160. In more detail, the latch mechanism 190 includes latching members 192 that extend into the latch coupling apertures 58,100,150,178,180 of the latch catch members 24,64,114,164 to latch the door 12. Removing the latch members 192 from the latch coupling apertures 58,100,150,178,180 releases the door 12 so it can be opened. The interaction of the latch mechanism 190 and the latch catch members 24,64,114,164 causes the barrier members 22,62,112,162 of the barrier assemblies 20,60,110, 160 to be pulled toward to the door 12 when the door 12 bulges outward. This further ensures that the barrier members 22,62,112,162 will be disposed in the area of any gaps that form between the top 2, bottom 4, or sidewalls 6,8 of the enclosure 1 and the door 12, thus preventing arc gasses from escaping the interior area of the enclosure 1.

While a few example embodiments of barrier assemblies 20,60,110,160 in accordance with example embodiments of the disclosed concept have been disclosed herein, it will be appreciated by those having ordinary skill in the art that various features of the barrier assemblies 20,60,110,160 may be replaced, duplicated or modified without departing from the scope of the disclosed concept. It will also be appreciated that various features of the enclosure 1 and door 12 may be modified without departing from the scope of the disclosed concept. It will further be appreciated that the disclosed concept may be adapted for use with a variety of types of enclosures without departing from the scope of the disclosed concept.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An enclosure comprising:
a top surface;
a bottom surface;
a rear surface;
a first sidewall;
a second sidewall;
a door configured to open and close, wherein the top surface, the bottom surface, the rear surface, the first sidewall, the second sidewall and the door, when closed, define an interior area; and
at least one barrier assembly attached to at least one of the top surface, the bottom surface, the first sidewall and the second sidewall in the interior area, the at least one barrier assembly comprising:
 a barrier member including a substantially planar barrier portion disposed substantially parallel to the one of the top surface, the bottom surface, the first sidewall, or the second sidewall that the at least one barrier assembly is attached to; and
 a spring assembly attached to the barrier member and configured to bias the barrier portion in a direction of the door, wherein the direction is substantially parallel to the one of the top surface, the bottom surface, the first sidewall, or the second sidewall that the at least one barrier assembly is attached to,
wherein when the door is moved outward, the spring assembly is structured to move the barrier member outward with the outward movement of the door so that the barrier member is disposed in a gap between the door and at least one of the top surface, the bottom surface, the first sidewall, and the second sidewall.

2. The enclosure of claim 1, wherein the door includes a latch mechanism; and wherein the at least one barrier assembly includes at least one latch catch member structured to interact with the latch mechanism.

3. The enclosure of claim 2, wherein the at least one barrier assembly includes two barrier members, four latch catch members and five spring assemblies.

4. The enclosure of claim 3, wherein the at least one barrier assembly is attached to the bottom surface.

5. The enclosure of claim 1, wherein the barrier member includes a lip; and wherein the lip and the barrier portion are disposed perpendicular with each other.

6. The enclosure of claim 1, wherein the at least one barrier assembly includes a bracket; and wherein the bracket and the barrier member are coupled by the spring assembly.

7. The enclosure of claim 6, wherein the spring assembly includes a spring disposed between the barrier member and the bracket; and wherein the spring further includes a fastener structured to pass through the spring.

8. The enclosure of claim 6, wherein the spring assembly is structured to bias the barrier member in a direction away from the bracket.

9. The enclosure of claim 1, wherein the door includes a latch mechanism; wherein the at least one barrier assembly includes at least one latch catch member structured to interact with the latch mechanism; wherein the at least one barrier assembly includes a bracket; and wherein the bracket and the barrier member are coupled by the spring assembly.

10. The enclosure of claim 9, wherein the at least one barrier assembly includes two barrier members, one bracket, four latch catch members and seven spring assemblies.

11. The enclosure of claim 10, wherein the at least one barrier assembly is attached to the top surface.

12. The enclosure of claim 9, wherein the at least one barrier assembly includes two barrier members, one bracket, two latch catch members and four spring assemblies.

13. The enclosure of claim 12, wherein the at least one barrier assembly is attached to at least one of the first sidewall and the second sidewall.

14. The enclosure of claim 9, wherein the at least one barrier assembly includes two barrier members, two brackets, three latch catch members and six spring assemblies.

15. The enclosure of claim 14, wherein the at least one barrier assembly is attached to at least one of the first sidewall and the second sidewall.

16. The enclosure of claim 1, wherein the interior area is structured to house electrical equipment.

17. The enclosure of claim 1, wherein the at least one barrier assembly is at least four barrier assemblies; wherein the at least four barrier assemblies are attached to the top surface, the bottom surface, the first sidewall, and the second sidewall, respectively.

18. The enclosure of claim 1, wherein the barrier members is structured to withstand arc gas expulsion.

19. An enclosure comprising:
a top surface;
a bottom surface;
a rear surface;
a first sidewall;
a second sidewall;
a door configured to open and close, wherein the top surface, the bottom surface, the rear surface, the first sidewall, the second sidewall and the door, when closed, define an interior area; and
at least one barrier assembly attached to at least one of the top surface, the bottom surface, the first sidewall and the second sidewall in the interior area, the at least one barrier assembly comprising:
 a barrier member including a substantially planar barrier portion disposed substantially parallel to one of the top surface, the bottom surface, the first sidewall, or the second sidewall; and
 a spring assembly attached to the barrier member and configured to bias the barrier portion in a direction of the door,
wherein the door includes a latch mechanism; and wherein the at least one barrier assembly includes at least one latch catch member structured to interact with the latch mechanism, and
wherein the at least one latch catch member includes a barrier coupling portion structured to couple with the barrier member; wherein the at least one latch catch member further includes a latch coupling portion extending in a direction perpendicular to the barrier coupling portion; and
wherein the latch coupling portion includes a latch coupling aperture formed therein and being structured to interact with the latch mechanism.

* * * * *